United States Patent
Lagedamont et al.

(10) Patent No.: US 6,402,479 B1
(45) Date of Patent: Jun. 11, 2002

(54) APPARATUS FOR PUMPING OUT TRANSFER CHAMBERS FOR TRANSFERRING SEMICONDUCTOR EQUIPMENT

(75) Inventors: Marc Lagedamont, Annecy; Roland Bernard, Viuz-la-Chiesaz; Eric Chevalier, Annecy le Vieux, all of (FR)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/614,593

(22) Filed: Jul. 12, 2000

(30) Foreign Application Priority Data

Apr. 20, 2000 (FR) .............................. 00 05096

(51) Int. Cl.⁷ .............................................. F04D 13/12
(52) U.S. Cl. ................ 417/201; 417/44.1; 417/205; 438/758
(58) Field of Search .................. 417/32, 36, 44.1, 417/44.2, 201, 202, 203, 205, 423.4; 438/758

(56) References Cited

U.S. PATENT DOCUMENTS

| | | | | |
|---|---|---|---|---|
| 5,062,771 A | * | 11/1991 | Satou et al. | 417/201 |
| 5,110,264 A | * | 5/1992 | Murry | 417/205 |
| 5,259,735 A | * | 11/1993 | Takahashi et al. | 417/205 |
| 5,733,104 A | * | 3/1998 | Conrad et al. | 417/202 |
| 5,873,942 A | * | 2/1999 | Park et al. | 417/205 |
| 6,257,835 B1 | * | 7/2001 | Kaehler | 417/205 |
| 6,274,507 B1 | * | 8/2001 | Narita et al. | 438/758 |

* cited by examiner

*Primary Examiner*—Michael Koczo
(74) *Attorney, Agent, or Firm*—Sughrue Mion, PLLC

(57) ABSTRACT

In the invention, the gases present in a transfer chamber are pumped out by means of a primary pump that is driven by variable-speed drive means, that is connected in series with a turbomolecular secondary pump, and that is associated with gas monitoring means for monitoring one or more appropriate characteristic parameters of the pumped gases and for producing control signals acting on the drive means of the primary pump so as to adapt its pumping speed in order to avoid any condensation or solidification of the gases in the airlock or transfer chamber. It is thus possible to optimize the speed at which the pressure is lowered, and to reduce the pollution brought into the process chamber.

11 Claims, 1 Drawing Sheet

APPARATUS FOR PUMPING OUT TRANSFER CHAMBERS FOR TRANSFERRING SEMICONDUCTOR EQUIPMENT

The present invention relates to methods and apparatus for pumping gases out from an airlock or transfer chamber for transferring semiconductors to a process chamber.

BACKGROUND OF THE INVENTION

In manufacturing semiconductor electronic components, an important step consists in treating a semiconductor substrate in a controlled atmosphere at very low pressure, e.g. for depositing layers of various materials by plasma deposition.

In industrial production, substrates in the form of wafers are conditioned and brought successively into a process chamber through an airlock or through a transfer chamber inside which the atmosphere is brought progressively to an appropriate pressure similar to the pressure inside the process chamber. For that purpose, use is made of a gas pumping system comprising a primary pump driven by drive means and connected via a pumping circuit to the airlock or to the transfer chamber for pumping out the gases until the appropriate pressure is reached.

In the process chamber, the atmosphere must be controlled to avoid the presence of any impurity or of any pollution. For that purpose the substrate must arrive in the process chamber in a satisfactory state of purity.

In known installations, when a dry primary pump is used to pump out the gases from the transfer chamber, the pumping speed is determined to reach the appropriate pressure after a conditioning duration that does not delay the transfer of the substrate to the process chamber. However, the conditioning of the substrate is often insufficient, and pollution and impurities appear in the process chamber. An object of the invention is to avoid bringing impurities and pollution into the process chamber.

OBJECTS AND SUMMARY OF THE INVENTION

The invention results from the observation that the operations involved in conditioning the substrate in the airlock or the transfer chamber frequently lead to the appearance of condensation or crystallization. The resulting solid or liquid elements then constitute pollution sources that work against effective treatment of the substrate in the process chamber.

Also, during the lowering of the pressure of the atmosphere in the airlock or in the transfer chamber, the substrate necessarily undergoes degassing, and it is important for the degassing to be sufficient before the substrate is inserted into the process chamber. Otherwise, the degassing continues in the process chamber, and the gases from that subsequent degassing constitute an additional pollution source during the treatment. Thus, another object of the invention is to improve the degassing of the substrates during their conditioning in the airlock or the transfer chamber, without delaying the transfer of the substrate to the process chamber.

To achieve these objects and others, the invention makes provision to control the lowering of the pressure of the atmosphere in the airlock or the transfer chamber during the conditioning, so as to avoid the appearance of any humidity or of any solidification of the gases.

Thus, a gas pumping system of the invention for pumping out gases from a transfer chamber for transferring semiconductor equipment comprises a primary pump driven by drive means and connected via a pumping circuit to the transfer chamber so as to pump the gases out from the transfer chamber until an appropriate pressure is reached; the drive means are adapted for providing variable-speed pumping; a turbomolecular secondary pump is interposed in the pumping circuit between the primary pump and the transfer chamber; and gas monitoring means are provided for monitoring one or more appropriate characteristic parameters of the pumped gases and for producing control signals acting on the drive means for adapting the pumping speed of the primary pump in order to avoid any condensation or solidification of the gases in the transfer chamber.

By continuously monitoring the pumped gases, it is possible to prevent any condensation or solidification of the gases from occurring, and therefore to prevent any pollution from being brought into the process chamber. This monitoring also makes it possible to optimize the speed at which the pressure is lowered, to reach the mean speed as quickly as possible, so that the conditioning time is not increased, and so that it even becomes possible, within the conditioning time, to reduce the pressure to a lower value that facilitates degassing of the substrate.

The gas monitoring means comprise a temperature sensor that is responsive to the temperature of the pumped gases, and/or a gas analyzer.

A frequent source of pollution is the humidity contained in the pumped atmosphere, which humidity tends to condense and to crystalize. In which case, the gas analyzer may advantageously be adapted for detecting and measuring the water spectrum line.

Another source of pollution is frequently the presence of hydrocarbons. In which case, the gas analyzer is adapted for detecting and measuring hydrocarbon spectrum lines.

In an advantageous embodiment, the system may further comprise pressure measurement means for measuring the pressure in a process chamber to which the transfer chamber is connected. It is thus possible to servo-control the pressure in the transfer chamber so as to avoid or to limit the transfer of pollutant matter from the process chamber to the transfer chamber. It is thus possible to increase the speed at which the following substrate is conditioned in the same transfer chamber, since this conditioning is not disturbed by pollution from the process chamber.

Preferably, the turbomolecular secondary pump may be of a robust type capable of operating as of the beginning of the pumping step by delivering the gases at atmospheric pressure. Thus, the turbomolecular pump is not associated with any branch pipe for starting pumping, and it constitutes the only pumping element connected to the transfer chamber. The risks of polluting the atmosphere in the transfer chamber and therefore in the process chamber are thus reduced.

In a method of the invention for pumping gases out from a transfer chamber for transferring semiconductors to a process chamber, the pumping speed at which the gases are pumped out from the transfer chamber is adapted as a function of one or more characteristic parameters of the pumped gases, so as to avoid or to limit condensation or solidification of the gases in the transfer chamber.

Advantageously, it is possible to optimize the pumping speed to reach the appropriate pressure in a shorter time, and to continue the pumping until a minimum residual pressure is reached, and to maintain the residual pressure momentarily, e.g. until the end of conditioning, at a value lower than the appropriate operating pressure of the transfer chamber, thereby facilitating degassing of the substrate.

By analyzing the pumped gases by means of a gas analyzer, it is possible for the atmosphere of the process chamber to be simultaneously monitored.

BRIEF DESCRIPTION OF THE DRAWINGS

Other objects, characteristics, and advantages of the present invention appear from the following description of particular embodiments given with reference to the accompanying drawings, in which.

MORE DETAILED DESCRIPTION

Figure 1:
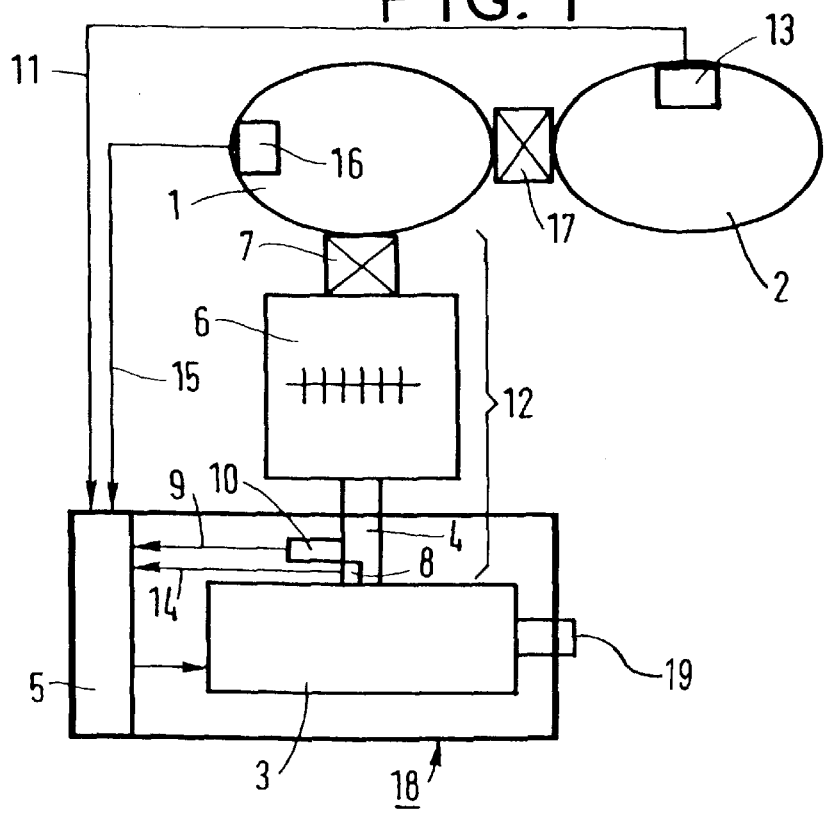
FIG. 1 is a diagrammatic view of the general structure of an embodiment of gas pumping apparatus of the present invention.

In the embodiment shown in FIG. 1, the pumping system of the invention makes it possible to pump gases out from an airlock or a transfer chamber 1 which is connected to a process chamber 2 via means enabling a semiconductor substrate to pass through.

The gas pumping system comprises a primary pump 3 driven by integrated drive means and connected to the airlock or the transfer chamber 1 via a pumping circuit 12 including a pipe 4 so as to pump the gases until an appropriate pressure is reached that is in the vicinity of the pressure in the process chamber 2. The drive means integrated in the primary pump 3 are suitable for pumping at a variable speed which is controlled by control apparatus 5 which may be of a type known per se.

A turbomolecular secondary pump 6 is interposed in the pumping circuit 12 between the pipe 4 connected to the primary pump 3 and the airlock or transfer chamber 1. An isolation valve 7 is interposed between the turbomolecular secondary pump 6 and the airlock or transfer chamber 1.

Gas monitoring means are provided for monitoring one or more appropriate characteristic parameters of the pumped gases and for producing control signals sent via one or more transmission lines 9 to the control apparatus 5 for acting on the drive means, and thus adapting the pumping speed of the primary pump 3 in order to avoid any condensation or solidification of the gases in the airlock or the transfer chamber 1.

Among the possible gas monitoring means, it is possible to choose, for example a temperature sensor 8 for measuring the temperature in the pipe 4 or a pressure sensor 16 for measuring the pressure in the airlock or transfer chamber 1. The measurement is then sent respectively via the transmission line 14 or via the transmission line 15 to the control apparatus 5. It is known that such condensation or solidification occurs only below a determined temperature threshold, and it is then possible to maintain the pumping speed at a value that is low enough to remain above the temperature threshold.

Preferably, the gas monitoring means include a gas analyzer 10, e.g. a mass spectrometer that can be adapted to detect and to measure certain spectrum lines of characteristic elements.

For example, a frequent source of condensation and solidification in treatment atmospheres is water vapor. Thus, the gas analyzer 10 may be adapted to detect and measure the water spectrum line, and to send signals to the control apparatus 5 via the transmission line 9, which signals make it possible to set the pumping speed at a value such that the water spectrum line is maintained at a value lower than an allowable threshold.

Another frequent source of pollution is condensation or solidification of hydrocarbons. To avoid this, the gas analyzer 10 may be adapted to detect and measure the hydrocarbon spectrum lines, and to send the signals necessary to maintaining the hydrocarbon spectrum lines at a value lower than an allowable threshold.

In the embodiment shown in FIG. 1, the system also includes pressure measurement means 13 for measuring the pressure 13 in the process chamber 2 to which the airlock or the transfer chamber 1 is connected. An isolation valve 17 is interposed between the airlock or transfer chamber 1 and the process chamber 2, making it possible for samples to pass through by opening/closing the airlock of the process chamber 2. The pressure measurement signal is sent via a transmission line 11 to the control apparatus 5 so as to servo-control the pumping speed of the primary pump 3 so as to establish the appropriate pressure in the airlock or transfer chamber 1 at a value slightly higher than the pressure in the process chamber 2, so as to avoid or to limit the transfer of pollutant matter from the process chamber 2 to the airlock or transfer chamber 1 on transferring the semiconductor substrate. The gases are delivered from the primary pump 3 via a pipe 19.

FIG. 1 shows a particularly advantageous embodiment of the present invention comprising isolation means making it possible to reduce further the disturbances caused by the pumping apparatus to the transfer chamber 1 or even to the process chamber 2. For this purpose, the primary pump 3, the gas analyzer means 10, and the control apparatus 5 are enclosed together in an isolation enclosure 18.

The isolation enclosure 18 is a sealed enclosure which forms a mechanically-rigid assembly and it may be provided with temperature monitoring and regulation apparatus or with active vibration compensation means (not shown) for actively compensating vibration.

Excellent results have been obtained using a turbomolecular secondary pump 6 of a type capable of operating as from the beginning of the pumping stage by delivering the gases at atmospheric pressure. Advantageously, this solution makes it possible to obtain a very advantageous saving in space, in terms of floor area. In this way, the turbomolecular secondary pump 6 is not associated with any branch pipe for starting up pumping, outside the valve 7, and it constitutes the only pumping element connected to the airlock or to the transfer chamber 1. For example, it is possible to use a pump of reference ATH 30 sold by Alcatel. Such a pump further offers the advantage of being compact, so that the system can be placed in the immediate vicinity of the transfer chamber 1, thereby simplifying all of the electrical links and the pipes.

The system designed in this way is capable of reducing the pressure from atmospheric pressure to pressures of about $10^{-3}$ Pascals in about thirty seconds. The pumping speed is servo-controlled to the expansion of the gases in order to avoid any phenomenon of solidification or condensation in the airlock or the transfer chamber 1.

In a gas pumping method of the invention for pumping out gases from an airlock or a transfer chamber 1 for transferring semiconductors to a process chamber 2, the pumping speed at which the gases are pumped out from the airlock or from the transfer chamber 1 is adapted as a function of one or more characteristic parameters of the pumped gases, so as to avoid or to limit condensation or solidification of the gases in the airlock or the transfer chamber 1.

Figure 2:
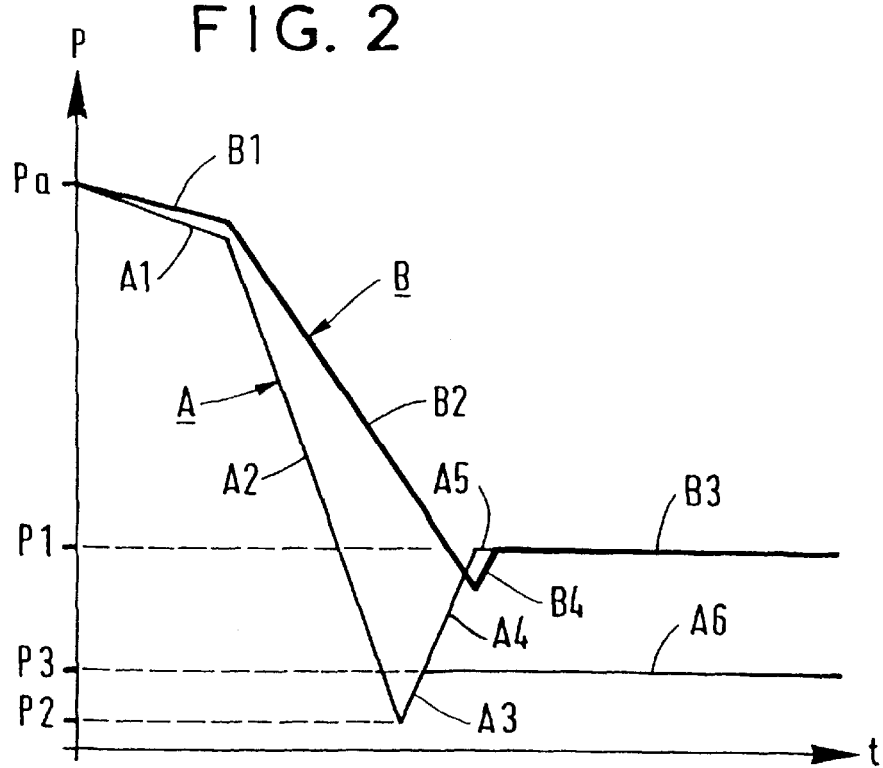
FIG. 2 shows the pressure reduction curves, a first curve showing the pressure reduction with apparatus of the invention, and a second curve showing the pressure reduction with known dry primary pump apparatus.

For example, with reference to curve a in FIG. 2, and starting from atmospheric pressure Pa, the pressure is reduced firstly relatively slowly during step $A_1$, so as to avoid condensation or solidification of the gases, then the speed of pressure reduction accelerates during step $A_2$ and it can become faster than the speed commonly chosen in known systems in which the primary pump driven at constant speed is used on its own. $P_2$ is the lowest pressure level reached, and it is the "conditioning pressure". The condensation and solidification of the gases takes place essentially during the first step $A_1$, when the pressures are still relatively high. Then the pressure rises again through $A_3$, $A_4$, and $A_5$ to reach the plateau $B_3$ which corresponds to the prior art case when only a primary pump 3 is present.

In contrast, with reference to curve B of FIG. 2, in known systems having pumps driven at constant speed, the pumping speed is lower because it is limited by the maximum allowable speed beyond which condensation and solidification phenomena occur during the first pumping stage. The pressure is reduced slowly during the step $B_1$, and then more quickly during the step $B_2$ until the lowest pressure level is reached, namely the "conditioning pressure", $P_1$, and then the pressure rises again to a plateau $B_3$.

In a variant of the invention shown in FIG. 2, the method of the invention makes it possible to optimize the pumping speed by accelerating the pumping significantly during the step $A_2$ when the pressure is already low, to reach as quickly as possible the appropriate transfer or operating pressure $P_1$, then to reach a residual minimum pressure $P_2$ and, via the rise $A_3$ and via a plateau $A_6$, to maintain the residual pressure momentarily at a value $P_3$ less than the operating pressure $P_1$ of the airlock or of the transfer chamber 1. The advantage of establishing the pressure $P_3$ is that it is possible to choose the pressure $P_3$ adapted to the pressure of the transfer chamber 1. Whereas the pressure $P_1$ established using known systems makes it necessary, after the substrate has been inserted into the process chamber 2, to lower the pressure to the operating pressure of said process chamber 2, which pressure may be equal to $P_3$.

During the period during which the residual pressure less than $P_1$ is applied to the substrate, the degassing of the substrate is facilitated, and the pollution that can be brought it into the process chamber 2 by the substrate is reduced.

With reference once again to FIG. 1, it can be understood that, by analyzing the pumped gases by means of the gas analyzer 10, it is possible to monitor simultaneously the atmosphere of the process chamber 2. Each time a substrate is transferred from the airlock or from the transfer chamber 1 to the process chamber 2, a portion of the gases present in the process chamber 2 can pass into the airlock or the transfer chamber 1, and it is then pumped out by the system of the invention, so that the gas analyzer 10 can reveal, analyze and quantify the gases in said portion of gases, and thus deliver to the user information that is useful for controlling the treatment.

For example, it is conceivable for the user then to compensate the atmosphere in the process chamber 2 by inserting appropriate elements in the atmosphere of the airlock or of the transfer chamber 1 during conditioning of the following substrate wafer, these elements then being transferred with the substrate into the process chamber 2.

The present invention is not limited to the embodiments which are explicitly described, but rather it includes the various variants and generalizations that are accessible to the person skilled in the art.

What is claimed is:

1. A gas pumping system for pumping out gases from a transfer chamber for transferring semiconductor equipment, said system comprising a primary pump driven by drive means and connected via a pumping circuit to the transfer chamber, wherein the primary pump pumps the gases out from the transfer chamber until an appropriate pressure is reached, wherein:

the drive means provide variable-speed pumping;

a turbomolecular secondary pump is interposed in the pumping circuit between the primary pump and the transfer chamber; and gas monitoring means monitor at least one appropriate characteristic parameter of the pumped gases and produce control signals that are sent to the drive means, wherein the control signals adapt the pumping speed of the primary pump based on the at least one monitored characteristic parameter and a condensation or solidification threshold of the at least one characteristic parameter of the gases in the transfer chamber.

2. A gas pumping system according to claim 1, wherein the gas monitoring means comprise a temperature sensor that is responsive to the temperature of the pumped gases.

3. A gas pumping system according to claim 1, wherein the gas monitoring means comprise a gas analyzer.

4. A gas pumping system according to claim 3, wherein the gas analyzer detects and measures the water spectrum line.

5. A gas pumping system according to claim 3, wherein the gas analyzer detects and measures hydrocarbon spectrum lines.

6. A gas pumping system according to claim 1, further comprising pressure measurement means for measuring the pressure in a process chamber to which the transfer chamber is connected, wherein the pressure measurement means servo-control the pressure in the transfer chamber to avoid or to limit the transfer of pollutant matter from the process chamber to the transfer chamber.

7. A gas pumping system according to claim 1, wherein the turbomolecular secondary pump operates at the beginning of the pumping step by delivering the gases at atmospheric pressure, and wherein the system does not include any branch pipe designed for starting pumping, and the turbomolecular pump constitutes the only pumping element connected to the transfer chamber.

8. A gas pumping system for pumping out gases from a transfer chamber for transferring semiconductor equipment, said system comprising a primary pump driven by drive means and connected via a pumping circuit to the transfer chamber, wherein the primary pump pumps the gases out from the transfer chamber until an appropriate pressure is reached, wherein:

the drive means provide variable-speed pumping;

a turbomolecular secondary pump is interposed in the pumping circuit between the primary pump and the transfer chamber; and gas monitoring means monitor one or more appropriate characteristic parameters of the pumped gases and produce control signals that are sent to the drive means, wherein the control signals adapt the pumping speed of the primary pump in order to avoid any condensation or solidification of the gases in the transfer chamber; wherein the gas monitoring means comprise a temperature sensor that is responsive to the temperature of the pumped gases.

9. A gas pumping system for pumping out gases from a transfer chamber for transferring semiconductor equipment, said system comprising a primary pump driven by drive means and connected via a pumping circuit to the transfer chamber, wherein the primary pump pumps the gases out from the transfer chamber until an appropriate pressure is reached, wherein:

the drive means provide variable-speed pumping;

a turbomolecular secondary pump is interposed in the pumping circuit between the primary pump and the transfer chamber; and gas monitoring means monitor one or more appropriate characteristic parameters of the pumped gases and produce control signals that are sent to the drive means, wherein the control signals adapt the pumping speed of the primary pump in order to avoid any condensation or solidification of the gases in the transfer chamber; wherein the gas monitoring means comprise a gas analyzer.

10. A gas pumping system according to claim 9, wherein the gas analyzer detects and measures the water spectrum line.

11. A gas pumping system according to claim 9, wherein the gas analyzer detects and measures hydrocarbon spectrum lines.

* * * * *